(12) United States Patent
Otsubo et al.

(10) Patent No.: US 12,255,151 B2
(45) Date of Patent: Mar. 18, 2025

(54) MODULE

(71) Applicant: Murata Manufacturing Co., Ltd., Nagaokakyo (JP)

(72) Inventors: Yoshihito Otsubo, Nagaokakyo (JP); Yukio Yamamoto, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 565 days.

(21) Appl. No.: 17/392,344

(22) Filed: Aug. 3, 2021

(65) Prior Publication Data

US 2021/0366839 A1 Nov. 25, 2021

Related U.S. Application Data

(63) Continuation of application No. PCT/JP2020/004904, filed on Feb. 7, 2020.

(30) Foreign Application Priority Data

Feb. 8, 2019 (JP) ................................. 2019-021886

(51) Int. Cl.
| | |
|---|---|
| *H01L 23/552* | (2006.01) |
| *H01L 23/367* | (2006.01) |
| *H01L 23/498* | (2006.01) |
| *H01L 25/065* | (2023.01) |

(52) U.S. Cl.
CPC ........ *H01L 23/552* (2013.01); *H01L 23/3675* (2013.01); *H01L 23/49811* (2013.01); *H01L 25/0655* (2013.01); *H01L 25/0657* (2013.01); *H01L 2225/06572* (2013.01)

(58) Field of Classification Search
None
See application file for complete search history.

(56) References Cited

U.S. PATENT DOCUMENTS

| | | | |
|---|---|---|---|
| 9,984,983 B2 * | 5/2018 | Chung | .................. H01L 21/565 |
| 11,145,569 B2 * | 10/2021 | Fujii | ....................... H01L 23/29 |
| 2004/0232452 A1 | 11/2004 | Tsuneoka et al. | |

(Continued)

FOREIGN PATENT DOCUMENTS

| | | |
|---|---|---|
| JP | H07-142532 A | 6/1995 |
| JP | 2010-080968 A | 4/2010 |

(Continued)

OTHER PUBLICATIONS

International Search Report for PCT/JP2020/004904 dated Apr. 21, 2020.
Written Opinion for PCT/JP2020/004904 dated Apr. 21, 2020.

*Primary Examiner* — Long Pham
(74) *Attorney, Agent, or Firm* — McDonald Hopkins LLC (57) ABSTRACT

A module (101) includes a substrate (1) having a first main surface (1a) and including wiring, a first component (31) having a circuit surface (31a), mounted on the first main surface (1a) such that the circuit surface (31a) faces the first main surface (1a), and having a ground terminal (10) on the circuit surface (31a), a first sealing resin (6a) disposed to cover the first main surface (1a) and the first component (31), and a heat dissipation portion (5) provided along an upper surface of the first sealing resin (6a). The wiring is connected to the ground terminal (10), and the module further includes a heat conducting member (7) connecting the wiring and the heat dissipation portion (5).

20 Claims, 9 Drawing Sheets

(56) References Cited

U.S. PATENT DOCUMENTS

| | | | |
|---|---|---|---|
| 2012/0008288 A1 | 1/2012 | Tsukamoto et al. | |
| 2014/0085829 A1 | 3/2014 | Yamashita | |
| 2014/0239464 A1 | 8/2014 | Chung et al. | |
| 2018/0166387 A1 | 6/2018 | Matsui et al. | |
| 2018/0374798 A1* | 12/2018 | Lee | H01L 21/4889 |
| 2019/0341329 A1 | 11/2019 | Yamamoto et al. | |
| 2019/0378779 A1* | 12/2019 | Fujii | H01L 23/498 |
| 2020/0020605 A1 | 1/2020 | Otsubo et al. | |
| 2020/0251422 A1* | 8/2020 | Lee | H01L 21/4853 |

FOREIGN PATENT DOCUMENTS

| | | |
|---|---|---|
| JP | 2012-019091 A | 1/2012 |
| JP | 2014-082447 A | 5/2014 |
| JP | 2014-154635 A | 8/2014 |
| JP | 2018-026394 A | 2/2018 |
| JP | 2018-098677 A | 6/2018 |
| WO | 2018/135555 A1 | 7/2018 |
| WO | 2018/181708 A1 | 10/2018 |
| WO | 2018/181871 A1 | 10/2018 |

* cited by examiner

MODULE

CROSS REFERENCE TO RELATED APPLICATION

This is a continuation of International Application No. PCT/JP2020/004904 filed on Feb. 7, 2020 which claims priority from Japanese Patent Application No. 2019-021886 filed on Feb. 8, 2019. The contents of these applications are incorporated herein by reference in their entireties.

BACKGROUND OF THE DISCLOSURE

Field of the Disclosure

The present disclosure relates to a module.

Description of the Related Art

A module having a structure including electronic components on a surface of a substrate and a resin sealing layer covering the electronic components is known. In such a module, when the mounted components include a heating component, the heat dissipation to the outside need to be performed well. The heat generated from a component, however, tends to be trapped in the module because of the sealing resin provided for protecting the mounted components and for facilitating mounting on a mother board. Meanwhile, in recent years, there has been in particular a demand for improvement in heat dissipation because the high density of mounted components reduces the distance between the components in the module.

An example of modules with enhanced heat dissipation is described in Japanese Patent Laying-Open No. 2018-26394 (PTL 1).

PTL 1: Japanese Patent Laying-Open No. 2018-26394

BRIEF SUMMARY OF THE DISCLOSURE

In the configuration described in PTL 1, a heating component that is a mounted electronic component is covered with a resin layer, and a depression is provided to a depth from the upper surface of the resin layer to a position near the upper surface of the electronic component. The depression is filled with a conductive paste material.

Heating in an electronic component occurs in a circuit portion where electricity flows. An electronic component having a circuit portion usually has a mounting surface on the side having the circuit portion, that is, the lower surface. In the configuration described in PTL 1, the conductive paste material contributing to heat dissipation is merely close to the upper surface of the electronic component and positioned at a far distance from the lower surface. That is, the conductive paste material contributing to the heat dissipation is disposed at a distance from the circuit portion of the electronic component that is a heating section, and does not provide sufficient heat dissipation.

An object of the present disclosure is therefore to provide a module capable of enhancing the heat dissipation from the components.

In order to solve the aforementioned object, a module based on the present disclosure includes a substrate having a first main surface and including wiring; a first component having a circuit surface, mounted on the first main surface such that the circuit surface faces the first main surface, and having a ground terminal on the circuit surface; a first sealing resin disposed to cover the first main surface and the first component; and a heat dissipation portion provided along an upper surface of the first sealing resin. The wiring is connected to the ground terminal. The module further includes a heat conducting member connecting the wiring and the heat dissipation portion.

According to the present disclosure, the heat generated in the first component can be transmitted efficiently to the heat dissipation portion via the heat conducting member. The heat dissipation from a component in the module thus can be enhanced.

DETAILED DESCRIPTION OF THE DISCLOSURE

The dimension ratio illustrated in the drawings does not always exactly correspond to the real one, and the dimension ratio is exaggerated in some cases for the sake of convenience of description. The notion "upper" and "lower" referred to in the following description does not always mean the absolutely upper and lower positions and may mean relatively upper and lower positions in an attitude illustrated in the drawings.

First Embodiment

Figure 1:
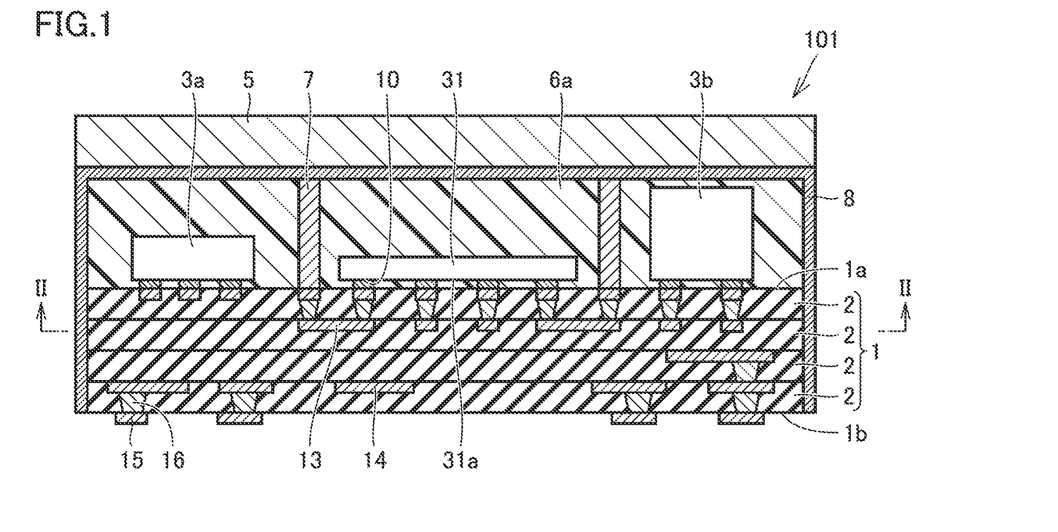
FIG. 1 is a cross-sectional view of a module in a first embodiment based on the present disclosure.
Figure 2:
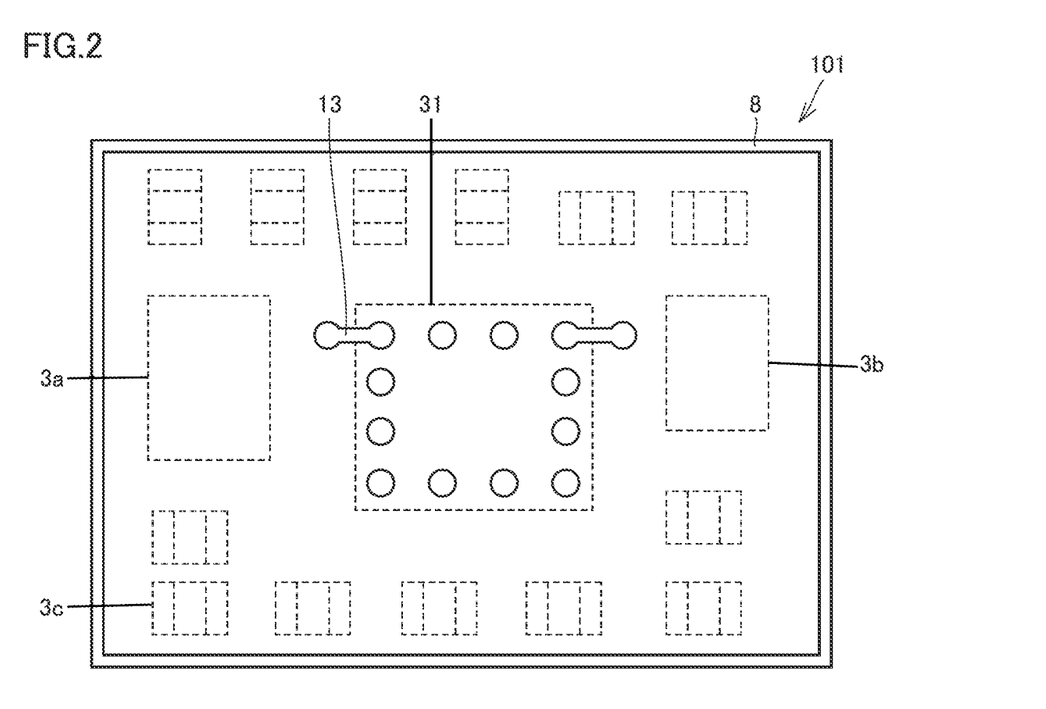
FIG. 2 is a cross-sectional view as viewed from the arrow II-II in FIG. 1.

Referring to FIG. 1 and FIG. 2, a module in a first embodiment based on the present disclosure will be described. A module 101 in the present embodiment is shown in FIG. 1. A cross-sectional view as viewed from the arrow II-II in FIG. 1 is shown in FIG. 2.

Module 101 in the present embodiment includes a substrate 1, a first component 31, a first sealing resin 6a, and a heat dissipation portion 5. Substrate 1 is a multi-layer substrate formed by laminating a plurality of insulating layers 2. Insulating layers 2 are ceramic layers but not limited thereto and may be, for example, resin layers. First component 31 is, for example, a semiconductor device such as an IC. Substrate 1 has a first main surface 1a. Substrate 1 includes wiring. In the example described here, the wiring includes internal wiring 13. On first main surface 1a, components 3a and 3b are mounted in addition to first component 31. First component 31 has a circuit surface 31a. Circuit surface 31a is a portion through which electricity flows and may heat during the operation of first component 31. First component 31 is mounted on first main surface 1a such that circuit surface 31a faces first main surface 1a. First component 31 has a ground terminal 10 on circuit surface 31a. First sealing resin 6a is disposed to cover first main surface 1a and first component 31. Heat dissipation portion 5 is provided along the upper surface of first sealing resin 6a. As used herein "provided along the upper surface" is not limited to being provided in direct contact. In other words, heat dissipation portion 5 is not necessarily in direct contact with the upper surface of first sealing resin 6a. Another layer may be interposed between heat dissipation portion 5 and the upper surface of first sealing resin 6a. In the example described here, a shield film 8 is formed to cover first sealing resin 6a. Heat dissipation portion 5 is disposed on the upper side of shield film 8. In other words, shield film 8 is interposed between heat dissipation portion 5 and the upper surface of first sealing resin 6a. The wiring of substrate 1 is connected to ground terminal 10. Module 101 further includes a heat conducting member 7 connecting the wiring and heat dissipation portion 5. In other words, heat conducting member 7 is disposed to transmit the heat from the wiring to heat dissipation portion 5.

Module 101 is configured such that the heat generated in first component 31 is transmitted from ground terminal 10 on circuit surface 31a of first component 31 to heat conducting member 7 via internal wiring 13 and further transmitted to heat dissipation portion 5. Heat conducting member 7 is, for example, a pillar-shaped conductor. Heat conducting member 7 may be, for example, a metal pin. Heat conducting member 7 may be formed by filling a depression with a conductive paste. Heat conducting member 7 may be formed by plating growth. The upper end of heat conducting member 7 is in contact with shield film 8. The heat transmitted to the upper end of heat conducting member 7 is transmitted to heat dissipation portion 5 via shield film 8. Although an example having shield film 8 has been described here, the presence of shield film 8 is not essential.

Substrate 1 has a second main surface 1b as a surface on the opposite side to first main surface 1a. An external connection terminal 15 is disposed on second main surface 1b. A conductor via 16 is connected to external connection terminal 15. Conductor via 16 penetrates insulating layer 2 included in substrate 1 in a thickness direction. Substrate 1 includes a conductor pattern 14 in its inside.

In the present embodiment, the wiring of substrate 1 is connected to ground terminal 10 of first component 31, and heat conducting member 7 is disposed such that the heat is transmitted from the wiring to heat dissipation portion 5. Thus, since the heat is dissipated through a shorter path from the circuit portion that is a heating section, the heat generated in first component 31 can be transmitted efficiently to heat dissipation portion 5 via heat conducting member 7. The heat dissipation from a component in the module thus can be enhanced.

As described in the present embodiment, heat conducting member 7 is preferably a pillar-shaped conductor. With this configuration, the heat can be transmitted efficiently.

As described in the present embodiment, heat dissipation portion 5 is preferably a heat dissipation member disposed on the upper side of first sealing resin 6a. The heat dissipation member may be a member provided as a separate portion from heat conducting member 7. The heat dissipation member may be various materials. The heat dissipation member may be, for example, a plate formed of a metal having excellent heat dissipation characteristics, such as aluminum. In terms of preventing peeling of the heat dissipation member due to a difference in thermal expansion coefficient between the heat dissipation member and the mold resin, the heat dissipation member may be a copper-aluminum cladding material.

As described in the present embodiment, it is preferable that shield film 8 at least covering first sealing resin 6a is provided, and the heat dissipation member is disposed outside of shield film 8. With this configuration, the module less affected by the outside can be formed.

As described in the present embodiment, the wiring may include internal wiring 13 provided within substrate 1. This configuration can prevent the displacement of heat conducting member 7 due to the solder flow between the electrodes for connecting ground terminal 10 and heat conducting member 7.

Second Embodiment

Figure 3:
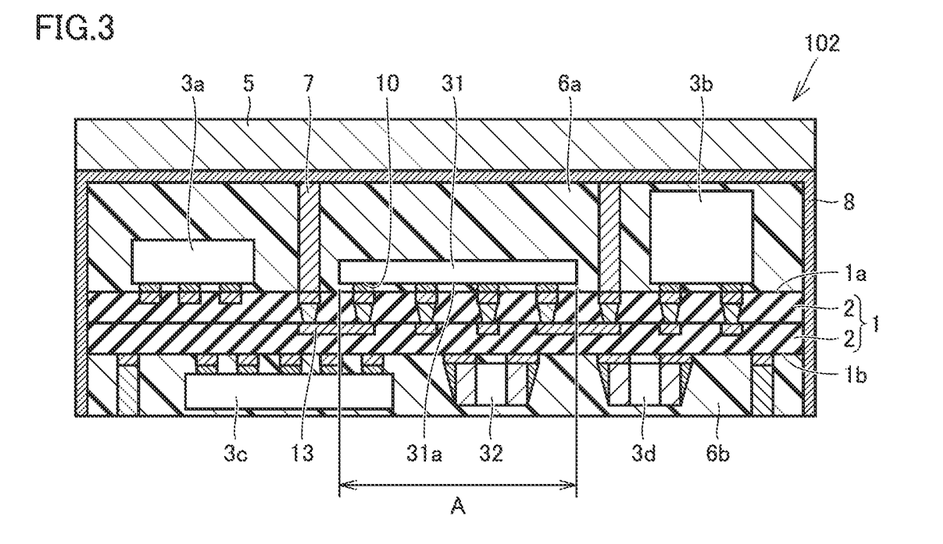
FIG. 3 is a cross-sectional view of a module in a second embodiment based on the present disclosure.

Referring to FIG. 3, a module in a second embodiment based on the present disclosure will be described. A module 102 in the present embodiment is shown in FIG. 3. Double-sided mounting is performed in module 102. More specifically, in module 102, substrate 1 has second main surface 1b on the opposite side to first main surface 1a, and a second component 32 is mounted on second main surface 1b. Second component 32 is disposed in a region A in which first component 31 is projected onto second main surface 1b. On second main surface 1b, components 3c and 3d are mounted in addition to second component 32. The other configuration is similar to module 101 described in the first embodiment.

The present embodiment also achieves an effect similar to that in the first embodiment. In particular, when second component 32 is provided in region A in this way, it is difficult to provide a conductor pillar for the heat dissipation from first component 31 so as to penetrate substrate 1. However, module 102 has heat conducting member 7 disposed to transmit the heat from the wiring to heat dissipation portion 5 and thus avoids the problem of region A difficult to use for the heat dissipation, so that the heat can be dissipated efficiently via heat conducting member 7. Furthermore, second component 32 can be less affected by the heat. In addition, since a through conductor for the heat dissipation need not be provided in substrate 1 that is a wiring board, the flexibility in design in the wiring board is increased.

Third Embodiment

Figure 4:
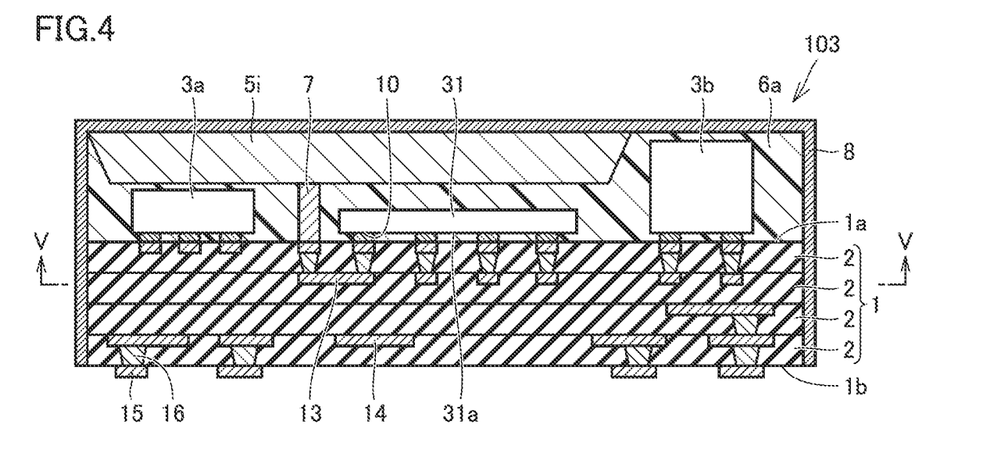
FIG. 4 is a cross-sectional view of a module in a third embodiment based on the present disclosure.
Figure 5:
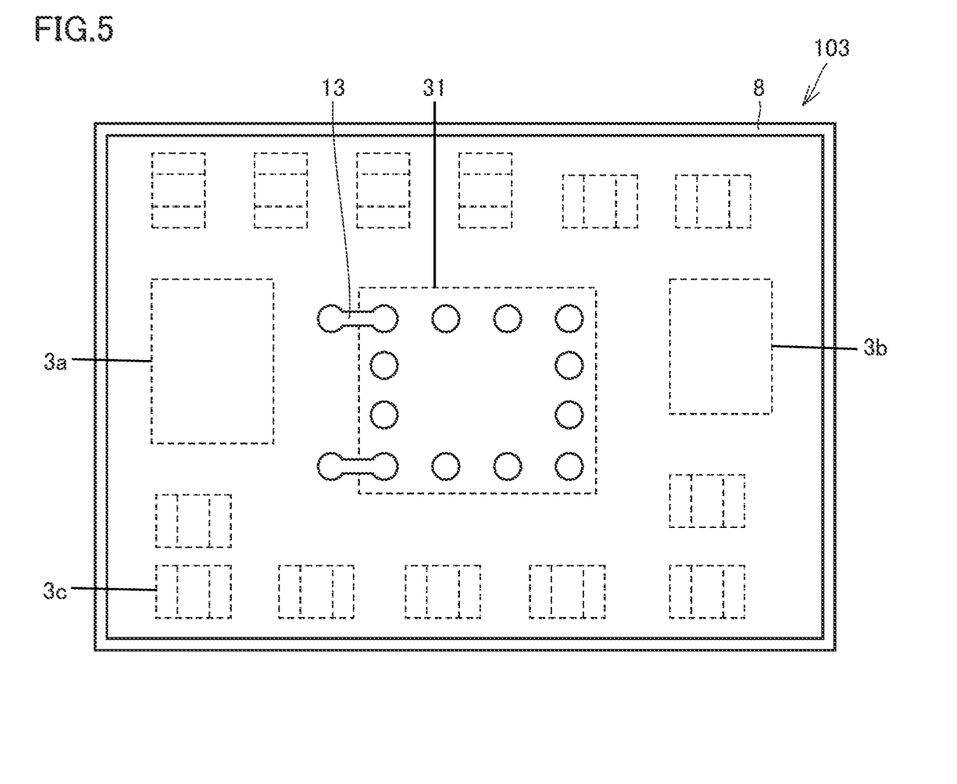
FIG. 5 is a cross-sectional view as viewed from the arrow V-V in FIG. 4.

Referring to FIG. 4 and FIG. 5, a module in a third embodiment based on the present disclosure will be described. A module 103 in the present embodiment is shown in FIG. 4. A cross-sectional view as viewed from the arrow V-V in FIG. 4 is shown in FIG. 5.

In module 103, the heat dissipation portion is provided not on the upper side but on the lower side of shield film 8. Here, a heat dissipation portion 5i is provided as the heat dissipation portion. Heat dissipation portion 5i covers not the whole but only a part of the upper surface of first sealing resin 6a. Module 103 includes shield film 8 at least covering first sealing resin 6a. The heat dissipation member as heat dissipation portion 5i is disposed on the lower side of shield film 8, first component 31 and components 3a and 3b are mounted as a plurality of components on first main surface 1a, and the heat dissipation member extends to a position lower than the upper surface of the highest component 3b among the components.

Heat dissipation portion 5i can be formed by forming first sealing resin 6a, first, and then performing removal processing on the upper surface of first sealing resin 6a to form a depression, and inserting the heat dissipation member in the depression.

With this configuration, when first component 31 heating most is a component different from the highest component, the lower end of the heat dissipation member can be disposed closer to first component 31. The heat dissipation from first component 31 therefore can be performed efficiently. Since heat dissipation portion 5i is disposed so as not to overlap with component 3b, the height of the entire module 103 can be reduced.

Figure 6:
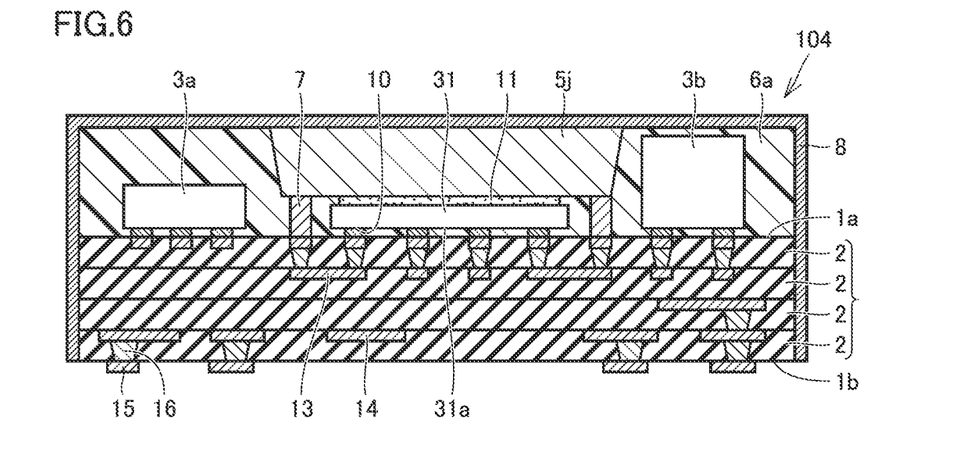
FIG. 6 is a cross-sectional view of a modification of the module in the third embodiment based on the present disclosure.

As another modification, a module 104 shown in FIG. 6 can be contemplated. Module 104 includes the heat dissipation member as a heat dissipation portion 5j. First component 31 heating most has a height smaller than component 3b. The heat dissipation member extends to a position lower than the upper surface of component 3b. The lower surface of the heat dissipation member is affixed to the upper surface of first component 31 by adhesive 11. Adhesive 11 does not necessarily serve a function as a heat dissipation path. Heat dissipation from first component 31 to heat dissipation portion 5j is mainly performed via heat conducting member 7. Heat dissipation portion 5j is disposed to cover a region corresponding to first component 31. Heat dissipation portion 5j is disposed to encompass a region in which first component 31 is projected upward.

To form heat dissipation portion 5j, any heat dissipation member is mounted on the upper surface of first component 31 through adhesive 11 before forming first sealing resin 6a. In doing so, the heat dissipation member is disposed in contact with the upper end of heat conducting member 7. First sealing resin 6a is formed to fill the periphery of the heat dissipation member after the heat dissipation member is mounted.

Fourth Embodiment

Figure 7:
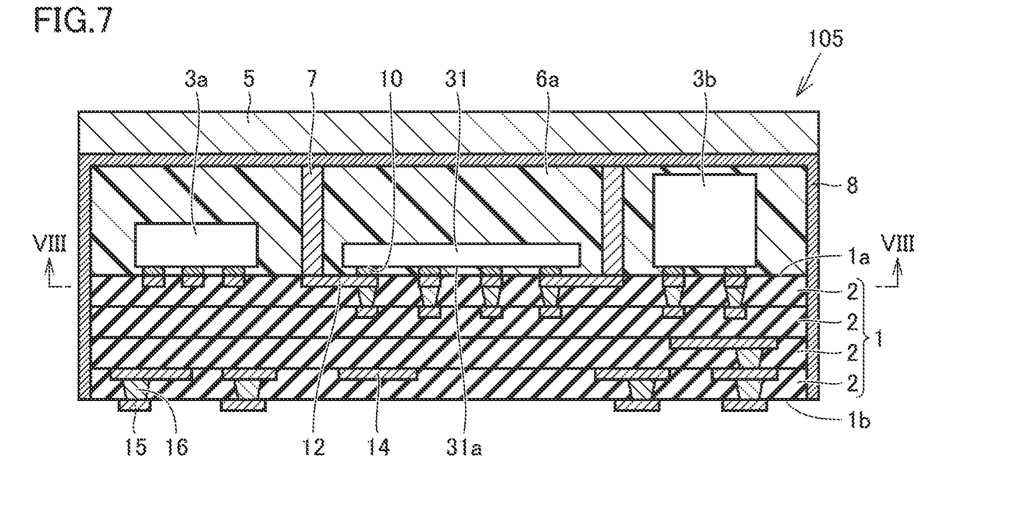
FIG. 7 is a cross-sectional view of a module in a fourth embodiment based on the present disclosure.
Figure 8:
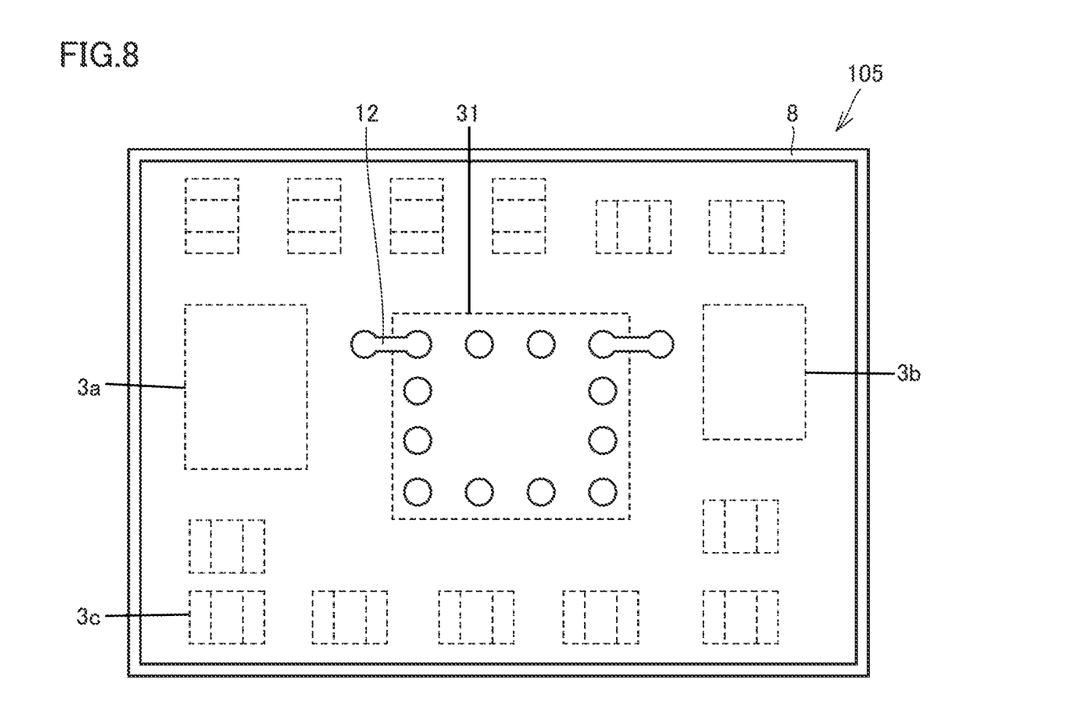
FIG. 8 is a cross-sectional view as viewed from the arrow VIII-VIII in FIG. 7.

Referring to FIG. 7 and FIG. 8, a module in a fourth embodiment based on the present disclosure will be described. A module 105 in the present embodiment is shown in FIG. 7. A cross-sectional view as viewed from the arrow VIII-VIII in FIG. 7 is shown in FIG. 8.

In module 101 described in the first embodiment, the heat dissipation path from ground terminal 10 of first component 31 to heat conducting member 7 passes through internal wiring 13. However, in module 105 described in the present embodiment, the heat dissipation path from ground terminal 10 of first component 31 to heat conducting member 7 passes through surface layer wiring 12.

The present embodiment also achieves an effect similar to that in the first embodiment. Since the heat dissipation path passes through surface layer wiring 12, the heat dissipation path can connect to the heat dissipation member with the shortest distance from the heating first component 31. However, in this configuration, the land electrode is large only on the periphery of the ground terminal 10 on a surface of substrate 1. In order to prevent an undesired flow of solder, therefore, the upper surface of the land electrode may be covered with a resist film to interrupt a flow of solder. In other words, in order to prevent the solder from flowing along the upper surface of surface layer wiring 12, a resist film may be placed to cover at least a part of the upper surface of surface layer wiring 12, more specifically, a portion between a connection section of ground terminal 10 of first component 31 and a connection section of heat conducting member 7. The resist film thus provided can serve a function like a dam to stop a flow of the solder.

It should be noted that, compared with when internal wiring 13 is used as the heat dissipation path, when surface layer wiring 12 is used, the area for routing the wiring is smaller due to the presence of mounted components, and the width of a conductor pattern tends to be short. As long as a sufficient width of the conductor pattern is ensured by using internal wiring 13 as the heat dissipation path, compared with using the surface layer wiring 12, it is preferable to use internal wiring 13 as the heat dissipation path rather than using surface layer wiring 12. On the other hand, when there are fewer mounted components and the area for wiring is ensured, it is preferable to use surface layer wiring 12 that can connect the heat dissipation path with the shortest distance.

As described in the present embodiment, the wiring may include surface layer wiring 12 disposed on a surface of substrate 1.

Figure 9:
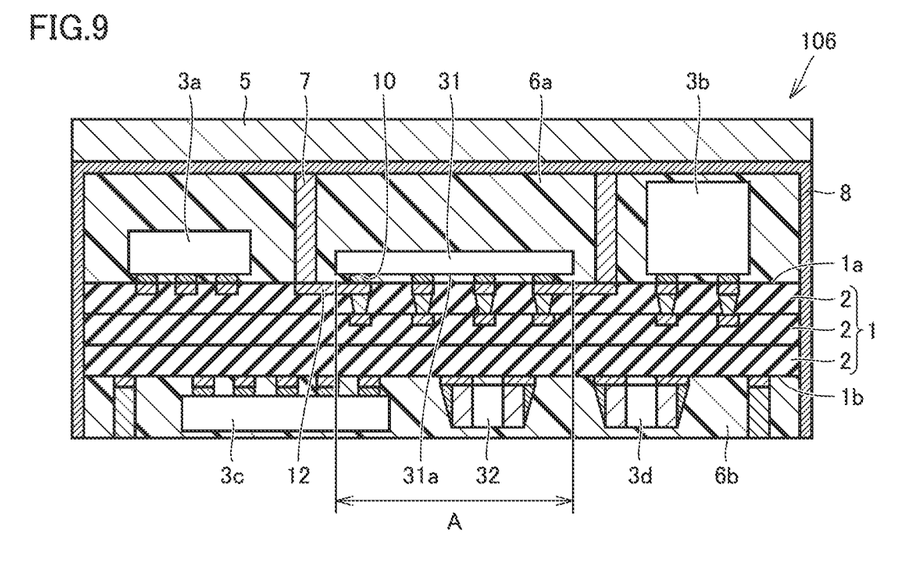
FIG. 9 is a cross-sectional view of a modification of the module in the fourth embodiment based on the present disclosure.

A module 106 shown in FIG. 9 can be contemplated as a modification of the present embodiment. Module 106 differs from module 105 in that it employs double-sided mounting.

Fifth Embodiment

Figure 10:
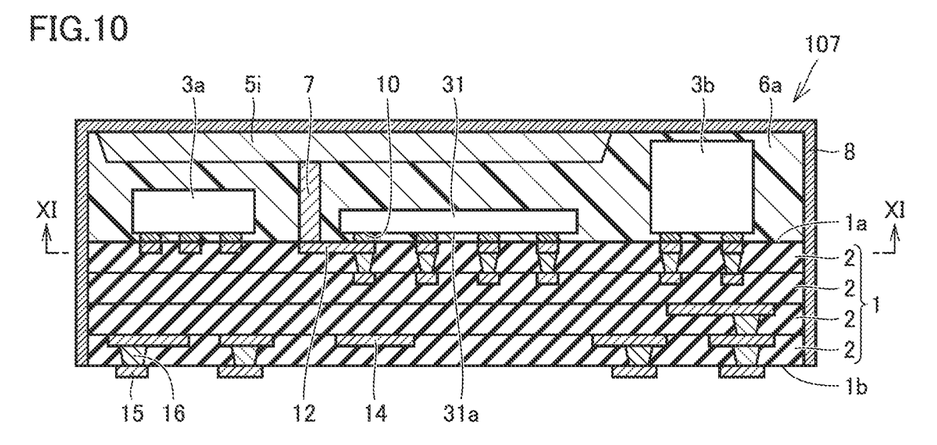
FIG. 10 is a cross-sectional view of a module in a fifth embodiment based on the present disclosure.
Figure 11:
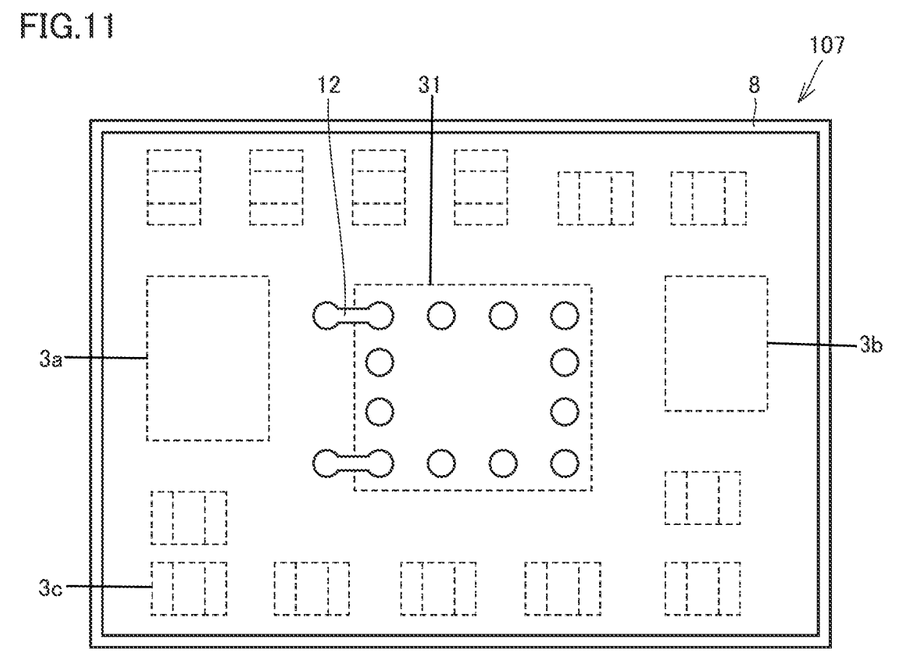
FIG. 11 is a cross-sectional view as viewed from the arrow XI-XI in FIG. 10.

Referring to FIG. 10 and FIG. 11, a module in a fifth embodiment based on the present disclosure will be described. A module 107 in the present embodiment is shown in FIG. 10. A cross-sectional view as viewed from the arrow XI-XI in FIG. 10 is shown in FIG. 11.

In module 107, surface layer wiring 12 is used as the heat dissipation path. In module 107, heat dissipation portion 5i is used. Heat dissipation portion 5i is disposed on the lower side of shield film 8. Heat dissipation portion 5i overlaps with a part of the lower surface of shield film 8. The lower surface of heat dissipation portion 5i is at a position lower than the upper surface of component 3b.

The present embodiment also achieves an effect similar to that of module 103 described in the third embodiment. Since heat dissipation portion 5*i* is disposed so as not to overlap with component 3*b*, the height of the entire module 107 can be reduced.

Sixth Embodiment

Figure 12:
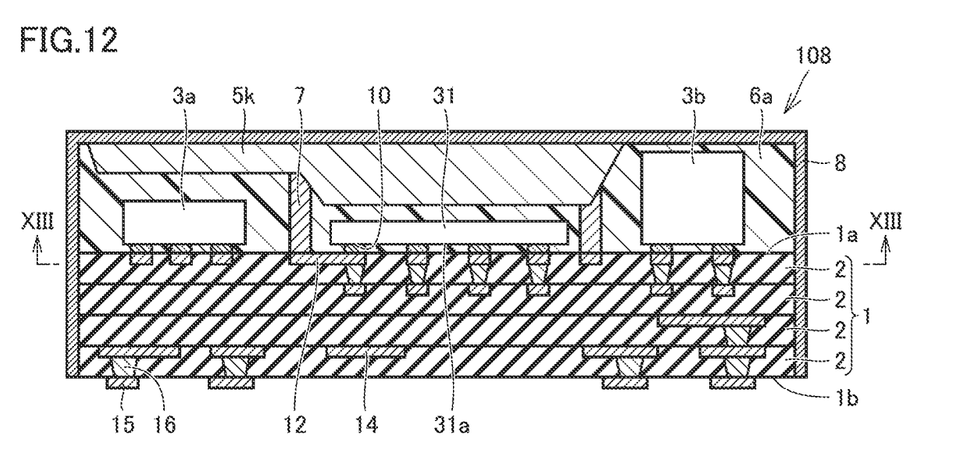
FIG. 12 is a cross-sectional view of a module in a sixth embodiment based on the present disclosure.
Figure 13:
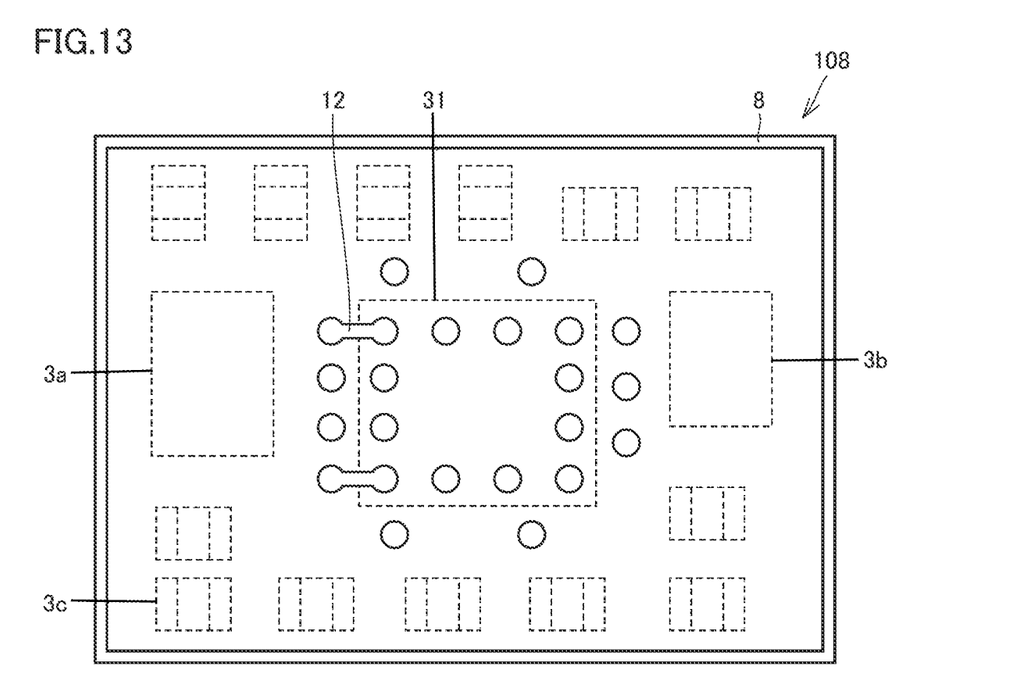
FIG. 13 is a cross-sectional view as viewed from the arrow XIII-XIII in FIG. 12.

Referring to FIG. 12 and FIG. 13, a module in a sixth embodiment based on the present disclosure will be described. A module 108 in the present embodiment is shown in FIG. 12. A cross-sectional view as viewed from the arrow XIII-XIII in FIG. 12 is shown in FIG. 13.

Module 108 includes a heat dissipation portion 5*k*. Heat dissipation portion 5*k* does not have a constant thickness, and the thickness varies with sections. Heat dissipation portion 5*k* is thick immediately above first component 31. In this section, the lower surface of heat dissipation portion 5*k* is close to the upper surface of first component 31. Component 3*a* has a height more than first component 31. Heat dissipation portion 5*k* is thin immediately above component 3*a*. The upper surface of heat dissipation portion 5*k* is at a constant height. The upper surface of heat dissipation portion 5*k* is in contact with the lower surface of shield film 8.

The present embodiment also achieves a similar effect. In module 108, not only heat conducting member 7 electrically and thermally connected to ground terminal 10 of first component 31 but also heat conducting member 7 not connected to first component 31 are disposed. Heat conducting member 7 on the right side in FIG. 12 applies to this. With such a configuration, a certain effect can be achieved because even the heat conducting member 7 that is not connected to first component 31 contributes to the transmission of the heat emitted from first component 31 to the periphery to heat dissipation portion 5*k*, to some degree.

(Variations of Heat Dissipation Portion and Heat Conducting Member)

Figure 14:
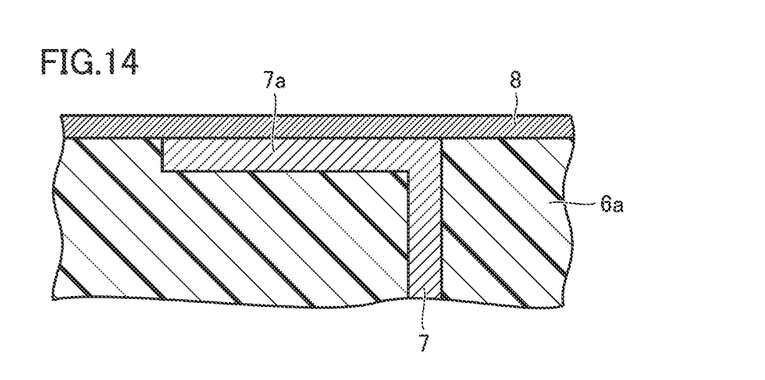
FIG. 14 is a partial cross-sectional view of a first example of a heat dissipation portion and a heat conducting member included in the module.

Variations of the heat dissipation portion and the heat conducting member can be contemplated. As shown in FIG. 14, a heat dissipation portion 7*a* may be provided, which extends to the side along the upper surface of first sealing resin 6*a* on the lower side of shield film 8. Here, heat dissipation portion 7*a* connects to heat conducting member 7. Heat conducting member 7 is a pillar-shaped conductor. Heat dissipation portion 7*a* is in contact with the lower surface of shield film 8. In the example shown in FIG. 14, the heat dissipation portion is continuous to the upper end of the pillar-shaped conductor.

Figure 15:
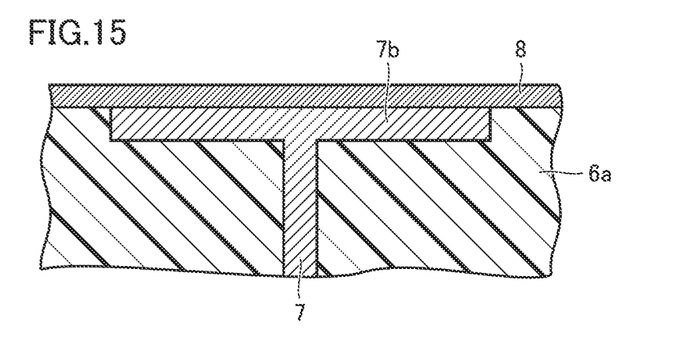
FIG. 15 is a partial cross-sectional view of a second example of the heat dissipation portion and the heat conducting member included in the module.

As shown in FIG. 15, heat dissipation portion 7*b* may extend in the shape of an umbrella along the upper surface of first sealing resin 6*a* on the lower side of shield film 8. The pillar-shaped conductor as heat conducting member 7 connects to heat dissipation portion 7*b* from a certain section on the underside. In this way, it is preferable that the heat dissipation portion includes a portion extending in a direction parallel to first main surface 1*a*.

Figure 16:
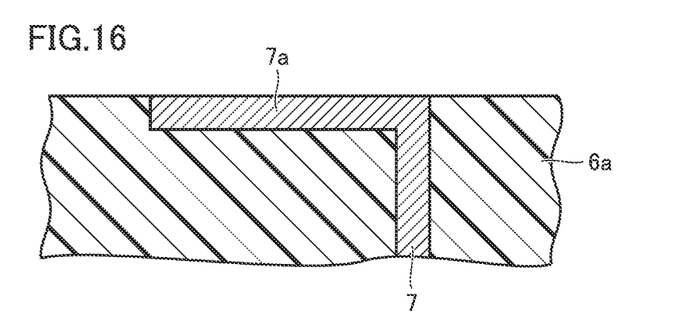
FIG. 16 is a partial cross-sectional view of a third example of the heat dissipation portion and the heat conducting member included in the module.
Figure 17:
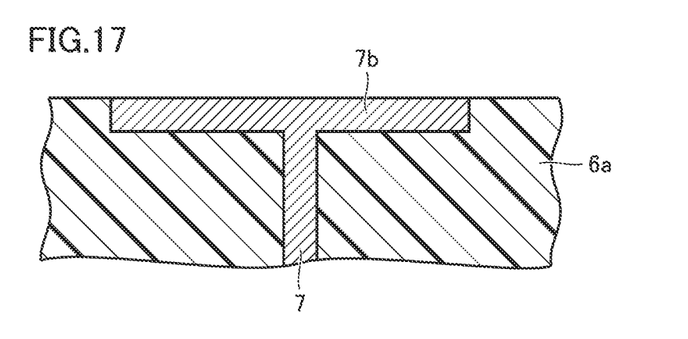
FIG. 17 is a partial cross-sectional view of a fourth example of the heat dissipation portion and the heat conducting member included in the module.

The presence of shield film 8 is not essential, and as shown in FIG. 16 and FIG. 17, shield film 8 may be absent.

Figure 18:
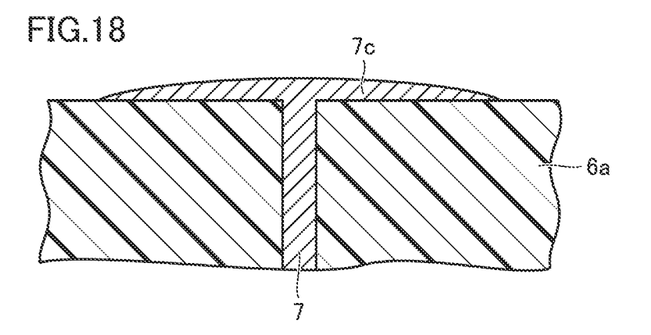
FIG. 18 is a partial cross-sectional view of a fifth example of the heat dissipation portion and the heat conducting member included in the module.

As shown in FIG. 18, a heat dissipation portion 7*c* may be provided. Heat dissipation portion 7*c* has a shape covering the upper surface of first sealing resin 6*a*. Heat dissipation portion 7*c* has the shape of a flat dome.

Figure 19:
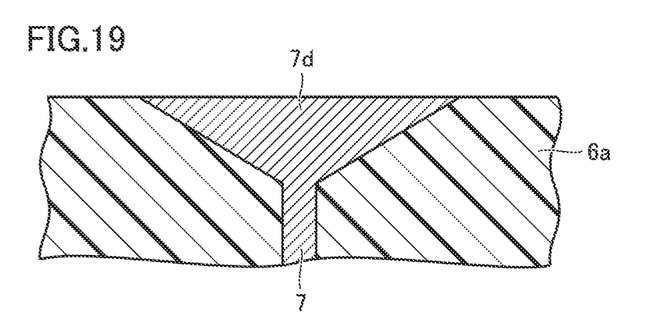
FIG. 19 is a partial cross-sectional view of a sixth example of the heat dissipation portion and the heat conducting member included in the module.

As shown in FIG. 19, a heat dissipation portion 7*d* may be provided. Heat dissipation portion 7*d* has a tapered shape having a wider upper portion.

In the examples shown in FIG. 14 to FIG. 19, the heat dissipation portion is integrated with a pillar-shaped conductor as the heat conducting member 7. The heat dissipation portion is formed of the same material as heat conducting member 7. In this way, it is preferable that the heat dissipation portion is integrated with the pillar-shaped conductor.

(Heat Dissipation Fin)

Figure 20:
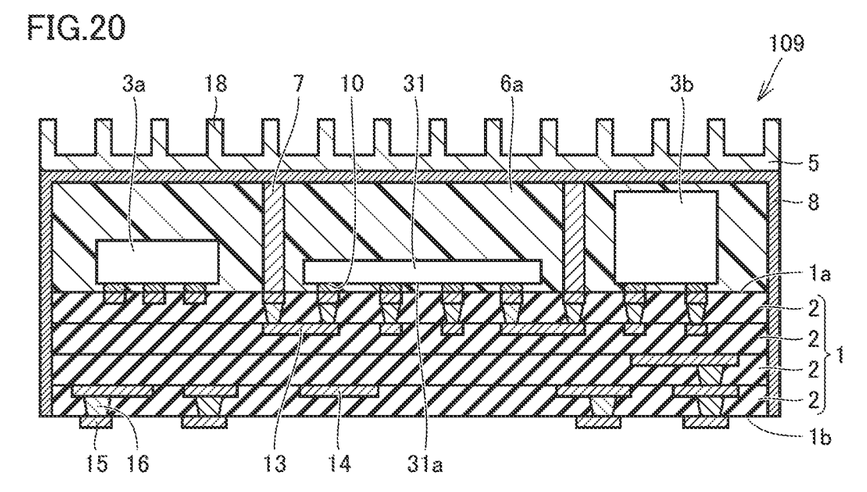
FIG. 20 is a cross-sectional view of an example in which the module in the first embodiment based on the present disclosure includes heat dissipation fins.

As a modification of the module, a configuration such as a module 109 shown in FIG. 20 can be contemplated. In module 109, heat dissipation portion 5 rests on the upper side of shield film 8. Heat dissipation portion 5 has heat dissipation fins 18. The internal structure of module 109 may be similar to that of module 101 described in the first embodiment. The heat dissipation member preferably includes heat dissipation fins 18. With such a configuration, the heat can be released to the surrounding air through heat dissipation fins 18, thereby efficiently dissipating the heat.

Some of the foregoing embodiments may be employed in combination. The embodiments disclosed here are intended to be illustrative only and not limitative in all respects. The scope of the present disclosure is shown in the claims, and it is intended that all modifications that come within the meaning and range of equivalence to the claims are embraced here.

1 substrate, 1*a* first main surface, 1*b* second main surface, 2 insulating layer, 3*a*, 3*b* component, 5, 5*i*, 5*j*, 5*k* heat dissipation portion, 6*a* first sealing resin, 6*b* second sealing resin, 7 heat conducting member, 7*a*, 7*b*, 7*c* heat dissipation portion, 8 shield film, 10 ground terminal, 11 adhesive, 12 surface layer wiring, 13 internal wiring, 14 conductor pattern, 15 external connection terminal, 16 conductor via, 17 pillar-shaped conductor, 18 heat dissipation fin, 31 first component, 31*a* circuit surface, 32 second component, 101, 102, 103, 104, 105, 106, 107, 108, 109 module.

The invention claimed is:

1. A module comprising:
    a substrate having a first main surface and including wiring;
    a first component having a circuit surface, mounted on the first main surface such that the circuit surface faces the first main surface, and having a ground terminal on the circuit surface;
    a first sealing resin disposed to cover the first main surface and the first component; and
    a heat dissipation portion provided along an upper surface of the first sealing resin, wherein a portion of the heat dissipation portion is disposed over a top surface of the first component in a depth lower than a top surface of the first sealing resin,
    wherein the wiring is connected to the ground terminal, and the module further comprises a heat conducting member connecting the wiring and the heat dissipation portion.

2. The module according to claim 1, wherein the heat conducting member is a pillar-shaped conductor.

3. The module according to claim 2, wherein the heat dissipation portion is continuous to an upper end of the pillar-shaped conductor.

4. The module according to claim 3, wherein the heat dissipation portion is integrated with the pillar-shaped conductor.

5. The module according to claim 4, wherein the heat dissipation portion includes a portion extending in a direction parallel to the first main surface.

6. The module according to claim 1, wherein the heat dissipation portion is a heat dissipation member disposed at the first sealing resin.

7. The module according to claim 6, further comprising a shield film at least covering the first sealing resin, wherein the heat dissipation member is disposed outside the shield film.

8. The module according to claim 6, wherein the heat dissipation member includes a heat dissipation fin.

9. A module comprising
- a substrate having a first main surface and including wiring;
- a first component having a circuit surface, mounted on the first main surface such that the circuit surface faces the first main surface, and having a ground terminal on the circuit surface;
- a first sealing resin disposed to cover the first main surface and the first component;
- a heat dissipation portion provided along an upper surface of the first sealing resin, wherein the heat dissipation portion is a heat dissipation member disposed at the first sealing resin; and
- a shield film at least covering the first sealing resin, wherein the heat dissipation member is disposed inside the shield film, a plurality of components are mounted on the first main surface, and the heat dissipation member extends to a position lower than an upper surface of a tallest component among the components,
- wherein the wiring is connected to the ground terminal, and the module further comprises a heat conducting member connecting the wiring and the heat dissipation portion.

10. The module according to claim 1, wherein the wiring includes surface layer wiring disposed on a surface of the substrate.

11. The module according to claim 1, wherein the wiring includes internal wiring provided within the substrate.

12. The module according to claim 1, wherein the substrate has a second main surface on an opposite side to the first main surface, and a second component is mounted on the second main surface.

13. The module according to claim 12, wherein the second component is disposed in a region in which the first component is projected onto the second main surface.

14. The module according to claim 2, wherein the heat dissipation portion is a heat dissipation member disposed at the first sealing resin.

15. The module according to claim 3, wherein the heat dissipation portion is a heat dissipation member disposed at the first sealing resin.

16. The module according to claim 7, wherein the heat dissipation member includes a heat dissipation fin.

17. The module according to claim 2, wherein the wiring includes surface layer wiring disposed on a surface of the substrate.

18. The module according to claim 3, wherein the wiring includes surface layer wiring disposed on a surface of the substrate.

19. The module according to claim 4, wherein the wiring includes surface layer wiring disposed on a surface of the substrate.

20. The module according to claim 5, wherein the wiring includes surface layer wiring disposed on a surface of the substrate.

* * * * *